United States Patent [19]

Smith

[11] Patent Number: 5,113,335

[45] Date of Patent: May 12, 1992

[54] HARMONIC CURRENTS ISOLATING NETWORK

[76] Inventor: Steve Smith, 5100 Channel Ave., Richmond, Calif. 94804

[21] Appl. No.: 888,137

[22] Filed: Jul. 23, 1986

[51] Int. Cl.⁵ ............................................. H02M 1/12
[52] U.S. Cl. ...................................... 363/44; 363/126
[58] Field of Search ........................... 363/39, 44-48, 363/126; 333/175, 176, 167, 181

[56] References Cited

U.S. PATENT DOCUMENTS

| | | | |
|---|---|---|---|
| 2,138,996 | 12/1938 | Blumlein | 333/176 |
| 3,461,372 | 8/1969 | Pickup et al. | 333/175 |
| 4,222,096 | 9/1980 | Capewell | 363/44 |
| 4,369,490 | 1/1983 | Blum | 363/48 |
| 4,591,963 | 5/1986 | Retotar | 363/17 |

FOREIGN PATENT DOCUMENTS

| | | | |
|---|---|---|---|
| 659504 | 4/1938 | Fed. Rep. of Germany | 333/181 |
| 1927415 | 1/1970 | Fed. Rep. of Germany | |
| 3012747 | 10/1981 | Fed. Rep. of Germany | 363/45 |
| 157261 | 12/1981 | Japan | 363/44 |
| 163271 | 9/1983 | Japan | 363/45 |
| 221850 | 9/1924 | United Kingdom | 363/45 |

OTHER PUBLICATIONS

Sheffield, "Filter Design Simplified," Audio Engineering, vol. 35, No. 5, pp. 26, 28, 58, May 1951.
Kwon, "Computer-Aided Lumped-Element Filter. Design and Analysis," Microwave Journal, pp. 53, 54, 57, Mar. 1976.

*Primary Examiner*—William H. Beha, Jr.
*Attorney, Agent, or Firm*—Thomas E. Schatzel

[57] ABSTRACT

A network for connection between an AC power line and a DC power supply to isolate harmonic currents generated by the DC power supply from the AC power supply, the network employing three similar portions each connected between a repective conductor of the (three phase) AC power line and a respective conductor of the DC power supply. Each of the portions includes the series combination of three "reflectors" each having the parallel resonant combination of an inductor and a capacitor. Further, three series resonant inductor-capacitor combinations are employed each connected between a unique pair of the DC power supply conductors.

5 Claims, 1 Drawing Sheet

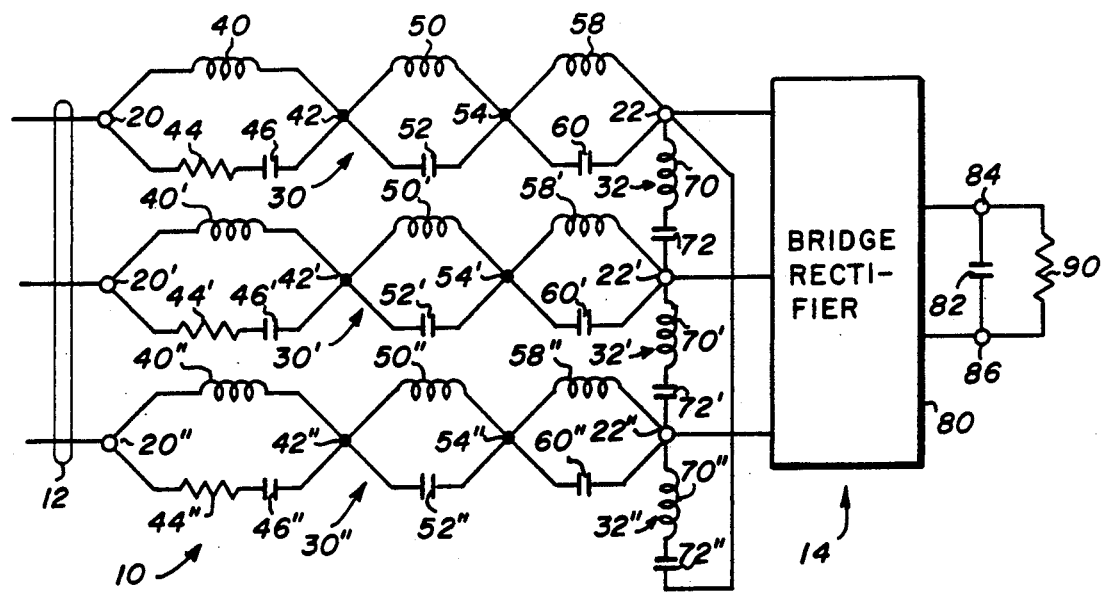
Fig_1
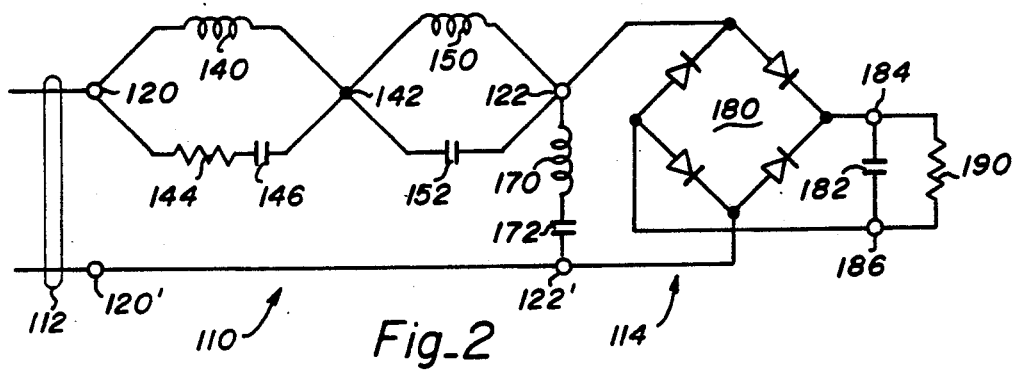
Fig_2
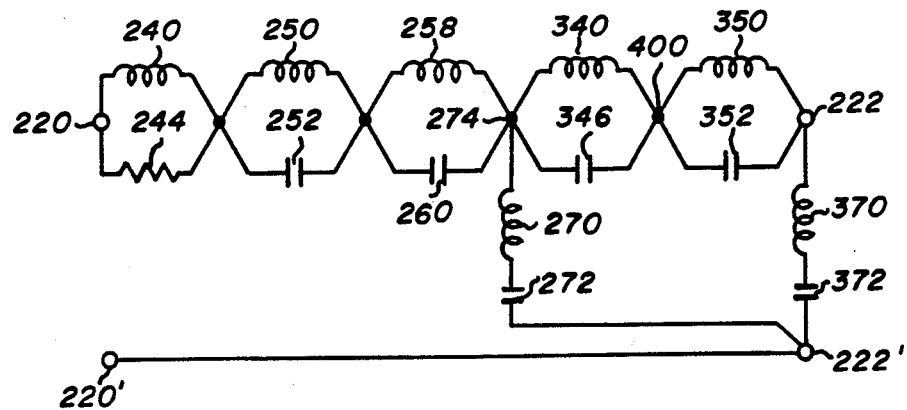
Fig_3

HARMONIC CURRENTS ISOLATING NETWORK

BACKGROUND OF THE INVENTION

1. Field of the Invention

The present invention relates to the power factor which loads present to AC power lines generally and more specifically to the reduction of the harmonic currents generated on an AC power line by a DC power supply.

2. Description of the Prior Art

The power factor that a load presents to an AC power line has long been of concern. At one time, the primary concern was the inductive component of some loads. Consider, for example, the section taken from the text entitled *American Electricians' Handbook* (8th ed. 1961) which was edited by Terrell Croft, revised by Clifford C. Carr, and published by McGraw Hill Inc.

"143. Correction of Low Power Factor. In industrial plants, excessively low power factor is usually due to underloaded induction motors because the power factor of motors is much less at partial loads than at full load. Where motors are underloaded new motors of small capacity should be substituted. Power factor can be corrected (1) by installing synchronous motors (2) by connecting static capacitors across the line." (end of section)

Of late, the "power factor" presented by DC power supplies has become a concern. Typically, DC power supplies employ a bridge rectifier, a filter capacitor, and, sometimes, a filter choke. The input of the rectifier is coupled (by a fuse, switch, etc.) across an AC power line. The output of the rectifier is either coupled by the choke across the capacitor (choke input filter) or, absent the choke, directly connected across the capacitor (capacitor input filter) to develop a DC (output) potential across the capacitor.

With the choke (input filter), DC power supplies draw from the AC power line a current the waveform of which approximates a square wave (when the inductance of the choke is much greater than what is commonly referred to as the "critical" inductance). Absent the choke, the waveform more approximates a series of pulses each of which is synchronized with a corresponding peak of the AC power-line potential. In either case, the current drawn from the AC power line includes harmonic components (currents), one for each of the odd harmonics of the AC power-line frequency. DC power supplies do not conform to all of the old power factor conventions. (For example, it makes little sense to define the power factor a DC power supply presents to an AC power line as the cosine of the phase angle between the voltage developed across the input of the DC power supply and the current flowing into it.) However, they (DC power supplies) do present many of the same problems. DC power supplies, like other loads having a relatively low power factor, draw from the AC power line a current the rms level of which is disproportionately high in relation to the current that should be drawn for the power consumed. (In other words, they do conform to the definition which states that the power factor of a load (in this case, a DC power supply) is given by the ratio of the actual power consumed (in this case by a load connected to the output of the DC power supply) (as indicated by a wattmeter) to the apparent power (as indicated by the combination of a (true rms, iron-vane or thermocouple-type) ammeter and a voltmeter) (connected to the input of the DC power supply).

A relatively high AC power-line rms current is of concern in that the AC power-generating facilities and AC power-transmission facilities (lines and transformers) must be sized to accommodate the current. Further, generation and transmission losses are primarily resistive losses which, therefore, increase as the square of the level of the rms AC power-line current. It is important to note that even relatively small loads (DC power supplies) may be of concern. Although a small personal computer, for example, may not draw the level of the current drawn by a large smoke stack scrubber, if the DC power supply of the computer has a relatively low power factor, the current drawn by the DC power supply may be of such a level as to limit what may also be plugged into a single AC power-line wall outlet.

In addition, DC power supplies present many special problems, particulary for the military. As the number of airborne and shipborne systems employing DC power supplies has increased, so has the level of harmonic currents generated on the various AC power lines. With the increased levels of harmonic currents has come an increase in the above mentioned generation and transmission problems. In addition, and of potentially much more serious consequence, the high levels of harmonic currents are causing problems of undesired system interaction. As a consequence, standards have been promulgated including those in the Department of Defense document which is identified as DOD-STD-1399(NAVY) SECTION 300 Aug. 1, 1978 and which is entitled MILITARY STANDARD INTERFACE STANDARD FOR SHIPBOARD SYSTEMS SECTION 300 ELECTRIC POWER, ALTERNATING CURRENT. Of particular relevance is the following section.

"6.2.7 Harmonic current. The operation of equipment shall be designed to have minimum harmonic distortion effect on the electrical system. The operation of such equipment with the following specified ratings shall not cause harmonic line currents to be generated that are greater than 3 percent of the unit's full load fundamental current between the 2nd and 32nd harmonic. . . . "

(For a power-source frequency of 60 Hz, a 1 kVA or more unit rating is specified.)

"Additionally, currents with frequencies from the 32nd harmonic through 20 kilohertz (kHz) shall not exceed 100/n percent . . . "

In Table I. (on page 5) the total harmonic distortion is limited to 5 percent; and, in section 6.2.2 the power factor is limited to the range of 0.8 lagging to 0.95 leading. Further, in Table I. (on page 5) the worst case frequency excursion from nominal frequency is listed as 5½ percent.

Heretofore, great difficulty has been had in meeting the above-mentioned standard.

A prior-art-type circuit for improving the power factor a DC power supply presents to an AC power line is shown in the German patent number DE 3012-747 and the Japanese patent number 58-163271. Both circuits include an inductor and a capacitor which is connected in parallel with the inductor. The inductor-capacitor combination is connected between the AC power line and the input of the bridge rectifier of a (capacitor-input-filter-type) DC power supply to couple the DC power supply to the AC power line. In the German patent it is indicated that the inductor-capacitor combination is usually tuned to the fifth but maybe the ninth or thirteenth harmonic of the AC power-line frequency. And, in the Japanese patent it is indicated that the purpose of the inductor-capacitor combination is to reduce the level of the third and fifth harmonic waves (currents?).

Although of some value in reducing the level of some of the harmonic currents, it is important to note that the reductions afforded by the above-mentioned inductor-capacitor combination does not approach that required to meet the above mentioned standard. Further, while reducing the level of certain harmonic currents, the above-mentioned inductor-capacitor combination may increase the level of other harmonic currents. Finally, The use of the above mentioned inductor-capacitor combination may reduce the level of the DC output potential developed by the associated DC power supply.

Disclosed in the British patent 1,472,411 of T. Kennedy is a filter network which is for use with a load having a non-linear control device (saturable reactor) and which is for absorbing unwanted harmonic currents. The filter network employs a plurality of filters each including an inductor and a capacitor which is connected in series with the (associated) inductor. Each of the filters (inductor-capacitor combinations) is connected in parallel with the load. An additional inductor is employed connected between the AC power line and the load to couple the load to the AC power line. It is indicated (on page 2 in lines 113-115 of the British patent) that each of the filters (inductor-capacitor combinations) is tuned to a frequency less than the harmonic frequency which it is to filter. Further, it is indicated (on page 3 in lines 115-128) that " . . . the existance of harmonics in the line makes it not only impractical, but also impossible to filter out all of the harmonic current. An attempt to do so may result in overloading the filters. Accordingly, it has been determined that the better approach is to remove only a percentage of the harmonic currents generated as a result of the load and control device. Thus, a certain amount of harmonic current is reflected back into the supply line. The amount of harmonic current so reflected can be adjusted depending upon the requirements of the utility system supplying power."

In an example in the British patent it is indicated (on page 4 in lines 109-112) that 70 percent of the harmonic currents are removed and 30 percent of the harmonic currents are reflected into the AC power line. Further, it is indicated (on page 4 in lines 112-115) that "(i)f the utility requirements on harmonics are more severe, it is possible to remove an even higher percentage such as 75%."

Again, although of some value in reducing the level of some of the harmonic currents, it is important to note that the reductions in the levels of harmonic currents afforded by the network disclosed in the above-mentioned British patent does not approach that required to meet the above mentioned standard.

Finally, in the U.S. Pat. No. 4,222,096 of D. Capewell and the U.S. Pat. No. 4,369,490 of F. Blum a circuit is disclosed which includes a capacitor connected in parallel with the input of the bridge rectfier of a (capacitor-input-type) DC power supply and an inductor connected between the AC power line and the input of the rectifier to couple the DC power supply to the AC power line. In the F. Blum patent it is indicated (on column 5 in lines 23-29) that without the above-mentioned circuit, the DC power supply was found to present a power factor of 65 percent to the AC power line. Also, it was found that without the above-mentioned circuit, the level of the third harmonic current was 88 percent, the level of the fifth harmonic current was 65 percent, and the level of the seventh harmonic current was 38 percent of the level of the fundamental current. In one example, with the above-mentioned circuit, the DC power supply was found to present a power factor of 94 percent to the AC power line. Also, with the above-mentioned circuit, the level of the third harmonic current was 20 percent, the level of the fifth harmonic current was 6 percent, and the level of the seventh harmonic current was 2 percent of the level of the fundamental current.

Although the above-mentioned circuit greatly increases the power factor a DC power supply presents to an AC power line and greatly reduces the levels of the harmonic currents. It is important to note that the DC power supply (and circuit combination) still does not even come close to meeting the above-mentioned military standard.

SUMMARY OF THE PRESENT INVENTION

It is therefor the primary object of the present invention to provide a means by which DC power supplies may be made to meet the DOD-STD-1399(NAVY) SECTION 300 Aug. 1, 1978 standard.

Another object of the present invention to provide a means by which DC power supplies may be made to meet commercial/industrial standards.

Another object of the present invention is to provide a means by which the levels of harmonic currents generated on an AC power line by a DC power supply may be reduced.

Still another object of the present invention is to provide a means by which the power factor a DC power supply presents to an AC power line may be improved.

Briefly, the preferred embodiment of the present invention employs three similar portions each connected between a respective conductor of a (three phase) AC power line and a respective conductor of a DC power supply. Each of the portions includes the series combination of three "reflectors" each having the parallel resonant combination of an inductor and a capacitor. Further, three series resonant inductor-capacitor combinations are employed each connected between a unique pair of the DC power supply conductors.

The ability to provide a means by which DC power supplies may be made to meet the DOD-STD-1399(NAVY) SECTION 300 Aug. 1, 1978 standard is the principal advantage of the present invention.

Another advantage of the present invention is the ability it affords to provide a means by which DC power supplies may be made to meet commercial/industrial standards.

Another advantage of the present invention is the ability it affords to provide a means by which the levels of harmonic currents generated on an AC power line by a DC power supply may be reduced.

Still another advantage of the present invention is the ability it affords to provide a means by which the power factor a DC power supply presents to an AC power line may be improved.

These and other objects and advantages of the present invention will no doubt be obvious to those skilled in the art after having read the following detailed description of the presently preferred embodiments which are illustrated in the several figures of the drawing.

IN THE DRAWING

FIG. 1 is a schematic diagram of the presently preferred embodiment in accordance with the present invention of a harmonic currents isolating network for military applications;

FIG. 2 is a schematic diagram of the presently preferred embodiment in accordance with the present invention of a harmonic currents isolating network for commercial/industrial applications; and, FIG. 3 is a schematic diagram of a harmonic currents isolating network for more stringent commercial/industrial applications.

DETAILED DESCRIPTION OF THE PREFERRED EMBODIMENT

In accordance with the present invention, illustrated in FIG. 1 of the drawing generally designated by the number 10 is the presently preferred embodiment of a military grade network for isolating from an AC power line the harmonic currents generated by a DC power supply. Also illustrated with network 10 is a (three phase) AC power line, generally designated 12, and a (capacitor-input-type) DC power supply, generally designated 14. Network 10 is shown to employ three terminals (nodes), respectively designated 20, 20', and 20", each for connection to a respective conductor of AC power line 12 and three terminals (nodes), respectively designated 22, 22', and 22", each for connection to DC power supply 14.

Network 10 also employs three similar portions, respectively designated 30, 30', and 30", each connected between a respective one of terminals 20, 20', and 20" and a respective one of terminals 22, 22', and 22". (Herein, similar portions/components are similiarly numbered.) Additionally, network 10 employs three similar portions, respectively designated 32, 32', and 32", each connected between a respective pair of terminals 20 and 20', 20' and 20", and 20" and 20.

Portion 30 includes an inductor (choke) 40 which is connected between terminal 20 and a node 42. Additionally, portion 30 includes a resistor 44 and a capacitor 46 which are connected in series between terminal 20 and node 42. Further, portion 30 includes an inductor 50 and a capacitor 52, the combination (of inductor 50 and capacitor 52) being connected in parallel (parallel resonant) between node 42 and a node 54. Finally, portion 30 includes an inductor 58 and a capacitor 60, the combination (of inductor 58 and capacitor 60) being connected in parallel (parallel resonant) between node 54 and terminal 22.

Portion 32 includes an inductor 70 and a capacitor 72, the combination (of inductor 70 and capacitor 72) being connected in series (series resonant) between terminals nodes 22 and 22'.

DC power supply 14 employs a bridge rectifier 80 and a filter capacitor 82. The input of rectifier 80 is connected to terminals 22, 22', and 22"; and, the output of the rectifier is (in this case) directly connected across capacitor 82 (between a pair of terminals 84 and 86) to develop a DC (output) potential (between the terminals) across the capacitor. A load (for DC power supply 14) is represented by a resistor 90 connected between terminals 84 and 86. Bridge rectifier 80 includes three rectifier diodes (not shown) each having a cathode coupled to terminal 84 and an anode coupled to a respective one of terminals 22, 22', and 22". Further, bridge rectifier 80 includes three more diodes (also not shown) each having an anode coupled to terminal 86 and a cathode coupled to a respective one of terminals 22, 22', and 22".

The inductor (70, 70', or 70") and capacitor (72, 72', or 72") combination of each of portions 32, 32', and 32" form (what is referred to herein as) a "resonator" for (it is believed) (in conjuction with power supply 14) generating harmonic currents for the power supply. In the presently preferred embodiment, the inductance of the inductor (70, 70', or 70") and the capacitance of the capacitor (72, 72', or 72") are chosen such that each inductor-capacitor combination resonates at a frequency near the sixth harmonic frequency of the power-line frequency and has a Q of approximately one to generate currents at both the fifth and the seventh harmonic frequencies.

The inductor-capacitor combinations of portion 30 (40 and 46, 50 and 52, and 58 and 60) (as well as the similar combinations of portions 30' and 30") form (what is referred to herein as) "reflectors" for (it is believed) reflecting harmonic energy back toward power supply 14. In the presently preferred embodiment, inductor 58 and capacitor 60 resonate near the seventh harmonic frequency; inductor 50 and capacitor 52 resonate near the fifth harmonic frequency; and, inductor 40 and capacitor 46 resonate near the thirteenth harmonic frequency. Each of the inductor-capacitor combinations of the "reflectors" have a Q which is in the range of 0.5 to 3. (A low "reflector" Q is employed to, among other things, avoid excessively attenuating the level of the fundamental current.) It is important to note that to attenuate the level of higher order harmonic currents, a resistor (44) is included in series with the capacitor (46) in the highest frequency "resonator". The resistor (44) resistance is approxamately equal to the characteristic impedance of each of the "resonators" (each of portions 32, 32', and 32"). Finally, it is important to note that no inductor-capacitor combination resonates at an exact multiple of the resonate frequency of another inductor-capacitor combination; because, it has been observed that certain combinations of frequency and Q have resulted in excessive levels of harmonic currents in the line.

In the presently preferred embodiment, the following component values are employed:

| | |
|---|---|
| inductor 40 | 2.41 mH, |
| resistor 44 | 12 ohms, |
| capacitor 46 | 23.2 mfd, |
| inductor 50 | 2.84 mH, |
| capacitor 52 | 97.4 mfd, |
| inductor 58 | 2.43 mH, |
| capacitor 60 | 46.9 mfd, |

-continued

| | |
|---|---|
| inductor 70 | 3.55 mH, |
| capacitor 72 | 10.95 mfd, |
| capacitor 82 | 3000 mfd, and |
| resistor 90 | a constant 2000 watt load (such as is presented by a switching power supply and its load). |

The following performance characteristics were calculated by means of the computer program entitled Micro-Cap II by Spectrum Software:

| | 57 Hz | 60 Hz | 63 Hz |
|---|---|---|---|
| level of the harmonic currents relative the fundamental | | | |
| 5th | 1.75% | 0.73% | 2.10% |
| 7th | 2.85% | 1.78% | 1.10% |
| 11th | 1.71% | 1.42% | 1.66% |
| 13th | 1.30% | 0.79% | 0.68% |
| 17th | 0.96% | 0.84% | 0.57% |
| 23rd | 0.49% | 0.87% | 0.58% |
| 25th | 0.16% | 0.38% | 0.49% |
| total harmonic distortion | | | |
| | 4.12% | 2.82% | 3.12% |
| phase angle in degrees | | | |
| | 14 leading | 13 leading | 15 leading |
| voltage level developed across the load (resistor 90) | | | |
| | 144 V DC | 144.4 V DC | 146.6 V DC |

Turning now to FIG. 2, the presently preferred embodiment of a commercial/industrial grade harmonic currents isolating network is illustrated generally designated 110. With network 110 is illustrated a (single phase) AC power line, generally designated 112, and another (capacitor-input-type) DC power supply, generally designated 114. Network 110 is shown to employ two terminals (nodes), respectively designated 120 and 120', each for connection to a respective conductor of AC power line 112 and two terminals (nodes), respectively designated 122 and 122', each for connection to DC power supply 114.

Network 110 employs two "reflectors" and one "resonator". The first "reflector" includes an inductor 140, which is connected between terminal 120 and a node 142. Additionaly, the first "reflector" includes a resistor 144 and a capacitor 146 which is connected in series with resistor 144 between terminal 120 and node 142. The second "reflector" includes another inductor 150 and another capacitor 152 which are connected in parallel between node 142 and terminal 122. Finally, the "resonator" includes still another inductor 170 and still another capacitor 172 connected in series between terminals 122 and 122'. Terminal 120' is directly coupled (connected) to terminal 122'.

DC power supply 114 employs a bridge rectifier 180 and a filter capacitor 182. The input of rectifier 180 is connected to terminals 122 and 122'; and, the output of the rectifier is directly connected across capacitor 182 (between a pair of terminals 184 and 186) to develop a DC (output) potential (between the terminals) across the capacitor. A load (for DC power supply 104) is represented by a resistor 190 connected between terminals 184 and 186.

In the presently preferred embodiment, the inductance of the inductor (170) and the capacitance of the capacitor (172) of the "resonator" are chosen such that they resonate at a frequency near the sixth harmonic frequency of the power-line frequency and have a Q of approximately one to generate currents at both the fifth and the seventh harmonic frequencies. Additionally, the (inductor 170 and capacitor 172) "resonator" generates an appreciable amount of third harmonic current without the high no load voltage characteristic of a "resonator" resonate at a lower frequency. The "reflector" which includes inductor 150 and capacitor 152 resonates at a frequency near the fifth harmonic frequency and has a Q of approximately one. The other "reflector", which includes inductor 140 and capacitor 146, resonates near the seventh harmonic frequency and has a Q of approximately ¾. The resistor (144) resistance is approxemately equal to the characteristic impedance of the "resonator".

In the presently preferred embodiment, the following component values are employed:

| | |
|---|---|
| inductor 140 | 36 mH, |
| resistor 144 | 115 ohms, |
| capacitor 146 | 4.84 mfd, |
| inductor 150 | 67.2 mH, |
| capacitor 152 | 5.08 mfd, |
| inductor 170 | 56.5 mH, |
| capacitor 172 | 4,27 mfd, |
| capacitor 182 | 600 mfd, and |
| resistor 190 | a constant 200 ohm resistive load | consuming approximately 100 watts.

The following performance characteristics were calculated:

| | 47 Hz | 50 Hz | 53 Hz | 57 Hz | 60 Hz | 63 Hz |
|---|---|---|---|---|---|---|
| level of the harmonic currents relative the fundamental | | | | | | |
| 3rd | 34.59% | 33.86% | 31.13% | 19.83% | 15.20% | 13.20% |
| 5th | 2.87% | 2.36% | 1.10% | 0.91% | 1.35% | 1.01% |
| 7th | 0.82% | 4.50% | 8.76% | 9.03% | 8.85% | 8.14% |
| 9th | 3.81% | 2.03% | 4.57% | 4.84% | 5.56% | 5.85% |
| 11th | 4.66% | 2.91% | 0.91% | 0.46% | 1.11% | 1.72% |
| 13th | 3.20% | 3.01% | 1.11% | 1.71% | 1.66% | 1.44% |
| 15th | 1.37% | 2.22% | 1.61% | 1.63% | 1.89% | 1.95% |
| 17th | 0.69% | 1.17% | 1.48% | 0.37% | 0.66% | 0.89% |
| 19th | 1.28% | 0.55% | 1.01% | 0.70% | 0.63% | 0.54% |
| power factor | | | | | | |
| | 0.91 | 0.91 | 0.90 | 0.89 | 0.93 | 0.94 |
| voltage level developed across the load (resistor 190) | | | | | | |
| | 134 V DC | 135 V DC | 138 V DC | 143 V DC | 144 V DC | 143 V DC |

For more stringent applications, a commercial/industrial grade harmonic currents isolating network is illustrated in FIG. 3 generally designated 210. Network 210 employs two terminals (nodes), respectively designated 220 and 220', each for connection to a respective conductor of an AC power line and two terminals (nodes), respectively designated 222 and 222', each for connection to a DC power supply. Additionally, network 210 employs five "reflectors" connected in series between terminals 220 and 222 and two "resonators". The first three "reflectors" include the parallel connection of an inductor 240 and a resistor 244 in the first; the parallel connection of an inductor 250 and a capacitor 252 in the second; and an inductor 258 and a capacitor 260 in the third. Connected between the third and fourth "reflector", the first "resonator" includes an inductor 270 and a capacitor 272 connected in series between a node 274 and terminal 222'. The last two "reflectors" include the parallel combination of an inductor 340 and a capacitor 346 in the fourth and the parallel connection of an inductor 350 and a capacitor 352 in the fifth. Finally, the last (second) "resonator" includes an inductor 370 and a capacitor 372 connected in series between terminals 222 and 222'. Terminal 220' is directly coupled (connected) to terminal 222'.

In the presently preferred embodiment, the following component values are employed:

| | | | | |
|---|---|---|---|---|
| inductor 240 | 30 mH, | | | |
| resistor 244 | 115 ohms, | | | |
| inductor 250 | 30.5 mH, | | | |
| capacitor 252 | 9.23 mfd, | freq. | 5th harmonic, Q | ½, |
| inductor 258 | 21.8 mH, | | | |
| capacitor 260 | 6.59 mfd, | freq. | 7th harmonic, Q | ½, |
| inductor 270 | 102 mH, | | | |
| capacitor 272 | 7.66 mfd, | freq. | 3rd harmonic, Q | 1, |
| inductor 340 | 16.9 mH, | | | |
| capacitor 346 | 5.12 mfd, | freq. | 9th harmonic, Q | ½, |
| inductor 350 | 13.9 mH, | | | |
| capacitor 352 | 4.19 mfd. | freq. | 11th harmonic, Q | ½, |
| inductor 370 | 51 mH, and | | | |
| capacitor 372 | 3.84 mfd, | freq. | 6th harmonic, Q | 1, | a DC power supply capacitor capacitance of 600 mfd, and a constant 200 ohm resistive load consuming approximately 100 watts.

The following performance characteristics were calculated:

| | 57 Hz | 60 Hz | 63 Hz |
|---|---|---|---|
| level of the harmonic currents relative the fundamental | | | |
| 3rd | 7.89% | 1.03% | 6.60% |
| 5th | 1.12% | 0.42% | 2.74% |
| 7th | 0.42% | 0.21% | 0.36% |
| 9th | 1.52% | 0.32% | 1.91% |
| 11th | 0.89% | 0.37% | 0.89% |
| 13th | 2.07% | 0.74% | 1.17% |
| 15th | 3.64% | 1.78% | 2.26% |
| 17th | 1.39% | 2.02% | 1.88% |
| 19th | 1.55% | 0.82% | 1.97% |
| 21st | 0.79% | 0.68% | 1.15% |
| 23rd | 0.93% | 0.56% | 0.75% |
| 25th | 0.62% | 0.19% | 0.99% |
| 27th | 0.55% | 0.47% | 2.00% |
| 29th | 0.50% | 0.44% | 1.50% |
| 31st | 0.30% | 0.38% | 0.26% |
| total harmonic distortion | | | |
| | 9.55% | 3.37% | 8.87% |
| voltage level developed across the load | | | |
| | 156 V DC | 147.5 V DC | 147 V DC |

(Of course, since the components employed are all passive, they may be scaled up or down. First, the ratio of the desired power rating to the given power rating is obtained. Then, the inductance of each of the inductors is divided by the ratio; the capacitance of each of the capacitors is multiplied by the ratio; and, the resistance of each of the resistors is divided by the ratio.)

In another embodiment, inductor 270 and capacitor 272 (of the first "resonator") are connected in series between terminal 222' and a node 400 at the juncture of inductors 340 and 350.

It is contemplated that after having read the preceeding disclosure, certain alterations and modifications of the present invention will no doubt become apparent to those skilled in the art. It is therefore intended that the following claims be interpreted to cover all such alterations and modifications as fall within the true spirt and scope of the invention.

What is claimed is:

1. A power supply system comprising in combination:
    an AC power line including a predetermined power line frequency;
    a power supply including an input that generates on said line currents at predetermined harmonics of said power line frequency when directly connected thereto; and
    a network connected between said input and said line to isolate therefrom said harmonic currents, said network including,
    a first terminal,
    a second terminal,
    a third terminal connected with said first and said second terminals to said line,
    a fourth terminal,
    a fifth terminal,
    a sixth terminal connected with said fourth and said fifth terminals to said input,
    a first reflector having
        an inductor coupled between said first and said fourth terminals and
        a capacitor connected in parallel with said first reflector inductor, a second reflector having
        an inductor coupled between said second and said fifth terminals and
        a capacitor connected in parallel with said second reflector inductor, a third reflector having
        an inductor coupled between said third and said sixth terminals and
        a capacitor connected in parallel with said third reflector inductor,
    a first resonator having
        an inductor and
        a capacitor coupled in series with said first resonator inductor between said fourth and said fifth terminals,
    a second resonator having
        an inductor and
        a capacitor coupled in series with said second resonator inductor between said fifth and said sixth terminals, and
    a third resonator having
        an inductor and
        a capacitor coupled in series with said third resonator inductor between said sixth and said fourth terminals.

2. A power supply system as recited in claim 1 wherein said first, said second, and said third resonators resonate at a frequency higher than the fifth and lower than the seventh harmonic frequencies of said power line frequency.

3. A power supply system as recited in claim 1 wherein each of said resonators and each of said reflectors have a Q which is greater than 0.5 and less than 3.0.

4. A network for use with an AC power line having a predetermined power line frequency and for use with a power supply having an input that generates on the line currents at predetermined harmonics of the power line frequency when directly connected thereto, the network for connection between the input and the line to isolate the harmonic currents therefrom, the network comprising in combination:

a first terminal;
a second terminal;
a third terminal for connection with said first and said second terminals to the line;
a fourth terminal;
a fifth terminal;
a sixth terminal for connection with said fourth and said fifth terminals to the input;
a first reflector including
 an inductor and
 a capacitor connected in parallel with said first reflector inductor;
a second reflector including
 an inductor and
 a capacitor connected in parallel with said second reflector inductor;
a third reflector including
 an inductor coupled in series with said first and said second reflectors between said first and said fourth terminals and
 a capacitor connected in parallel with said third reflector inductor;
a fourth reflector including
 an inductor and
 a capacitor connected in parallel with said fourth reflector inductor;
a fifth reflector including
 an inductor and
 a capacitor connected in parallel with said fifth reflector inductor;
a sixth reflector including
 an inductor coupled in series with said fourth and said fifth reflectors between said second and said fifth terminals and
 a capacitor connected in parallel with said sixth reflector inductor;
a seventh reflector including
 an inductor and
 a capacitor connected in parallel with said seventh reflector inductor;
a eighth reflector including
 an inductor and
 a capacitor connected in parallel with said eighth reflector inductor;
a ninth reflector including
 an inductor coupled in series with said seventh and said eighth reflectors between said third and said sixth terminals and
 a capacitor connected in parallel with said ninth reflector inductor;
a first resonator including
 an inductor and
 a capacitor coupled in series with said first resonator inductor between said fourth and said fifth terminals;
a second resonator including
 an inductor and
 a capacitor coupled in series with said second resonator inductor between said fifth and said sixth terminals; and
a third resonator including
 an inductor and
 a capacitor coupled in series with said third resonator inductor between said sixth and said fourth terminals.

5. A network for use with an AC power line (12) having a predetermined power line frequency and for use with a power supply (14) having an input that generates on the line currents at predetermined harmonics of the power line frequency when directly connected thereto, the network for connection between the input and the line to isolate the harmonic currents therefrom, the network comprising in combination:

a first terminal (20);
a second terminal (20');
a third terminal (20") for connection with said first and said second terminals to the line;
a fourth terminal (22);
a fifth terminal (22');
a sixth terminal (22") for connection with said fourth and said fifth terminals to the input;
a first reflector including
 an inductor (58) and
 a capacitor (60) connected in parallel with said first reflector inductor;
a second reflector including
 an inductor (50) and
 a capacitor (52) connected in parallel with said second reflector inductor;
a third reflector coupled in series with said first and said second reflectors between said first and said fourth terminals, said third reflector including
 an inductor (40),
 a resistor (44), and
 a capacitor (46);
a fourth reflector including
 an inductor (58') and
 a capacitor (60') connected in parallel with said fourth reflector inductor;
a fifth reflector including
 an inductor (50') and
 a capacitor (52') connected in parallel with said fifth reflector inductor;
a sixth reflector coupled in series with said fourth and said fifth reflectors between said second and said fifth terminals, said sixth reflector including
 an inductor (40'),
 a resistor (44'), and
 a capacitor (46');
a seventh reflector including
 an inductor (58") and
 a capacitor (60") connected in parallel with said seventh reflector inductor;
a eighth reflector including
 an inductor (50") and
 a capacitor (52") connected in parallel with said eighth reflector inductor;
a ninth reflector coupled in series with said seventh and said eighth reflectors between said third and said sixth terminals, said ninth reflector including
 an inductor (40"),
 a resistor (44"), and
 a capacitor (46");
a first resonator including
 an inductor (70) and
 a capacitor (72) coupled in series with said first resonator inductor between said fourth and said fifth terminals;
a second resonator including
 an inductor (70') and a capacitor (72') coupled in series with said second resonator inductor between said fifth and said sixth terminals; and a third resonator including an inductor (70") and a capacitor (72") coupled in series with said third resonator inductor between said sixth and said fourth terminals.

* * * * *